US008164397B2

(12) United States Patent
Wang et al.

(10) Patent No.: US 8,164,397 B2
(45) Date of Patent: Apr. 24, 2012

(54) METHOD, STRUCTURE, AND DESIGN STRUCTURE FOR AN IMPEDANCE-OPTIMIZED MICROSTRIP TRANSMISSION LINE FOR MULTI-BAND AND ULTRA-WIDE BAND APPLICATIONS

(75) Inventors: Guoan Wang, South Burlington, VT (US); Wayne H. Woods, Jr., Burlington, VT (US)

(73) Assignee: International Business Machines Corporation, Armonk, NY (US)

( * ) Notice: Subject to any disclaimer, the term of this patent is extended or adjusted under 35 U.S.C. 154(b) by 375 days.

(21) Appl. No.: 12/542,368

(22) Filed: Aug. 17, 2009

(65) Prior Publication Data

US 2011/0037533 A1 Feb. 17, 2011

(51) Int. Cl.
*H03H 7/38* (2006.01)

(52) U.S. Cl. .......................................... 333/33; 333/238

(58) Field of Classification Search .................... 333/33, 333/1, 4, 5, 238, 246

See application file for complete search history.

(56) References Cited

U.S. PATENT DOCUMENTS

| | | | | |
|---|---|---|---|---|
| 4,167,714 | A | 9/1979 | Flora | |
| 5,408,053 | A * | 4/1995 | Young | 174/264 |
| 5,594,393 | A * | 1/1997 | Bischof | 333/26 |
| 5,634,208 | A | 5/1997 | Nishikawa et al. | |
| 5,659,273 | A | 8/1997 | Harpham | |
| 5,712,607 | A * | 1/1998 | Dittmer et al. | 333/238 |
| 6,466,112 | B1 * | 10/2002 | Kwon et al. | 333/243 |
| 7,479,842 | B2 | 1/2009 | Gaucher et al. | |
| 2001/0015684 | A1 * | 8/2001 | Kim et al. | 333/238 |
| 2005/0262458 | A1 | 11/2005 | Gordin et al. | |
| 2006/0197119 | A1 | 9/2006 | Chinthakindi et al. | |

* cited by examiner

*Primary Examiner* — Stephen Jones

(74) *Attorney, Agent, or Firm* — Anthony Canale; Roberts Mlotkowski Safran & Cole, P.C.

(57) ABSTRACT

A method, structure, and design structure for an impedance-optimized microstrip transmission line for multi-band and ultra-wide band applications. A method includes: forming a plurality of openings in a ground plane associated with a signal line; forming a plurality of capacitance plates in the plurality of openings; and connecting the plurality of capacitance plates to the signal line with a plurality of posts extending between the signal line and the plurality of capacitance plates.

20 Claims, 7 Drawing Sheets

METHOD, STRUCTURE, AND DESIGN STRUCTURE FOR AN IMPEDANCE-OPTIMIZED MICROSTRIP TRANSMISSION LINE FOR MULTI-BAND AND ULTRA-WIDE BAND APPLICATIONS

FIELD OF THE INVENTION

The invention generally relates to semiconductor transmission lines and, more particularly, to a method, structure, and design structure for an impedance-optimized microstrip transmission line for multi-band and ultra-wide band applications.

BACKGROUND

Microwave and millimeter-wave (MMW) communication systems are commonly constructed with various components and subcomponents such as receiver, transmitter, and transceiver modules, as well as other passive and active components, which are fabricated using MIC (Microwave Integrated Circuit) and/or MMIC (Monolithic Microwave Integrated Circuit) technologies. The system components and/or subcomponents can be interconnected using various types of transmission media such as transmission lines (e.g., microstrip, slotline, CPW (coplanar waveguide), CPS (coplanar stripline), ACPS (asymmetric coplanar stripline), etc.) or coaxial cables and waveguides.

Microstrip transmission lines are commonly used in radio frequency (RF) CMOS/SiGe chips, where wiring is not dense. On the other hand, coplanar waveguides are commonly used where wiring density is relatively high, such as in CMOS chips, for example, where it is difficult to create an explicit return path below the signal line. A third structure referred to as a microstrip transmission line having side shielding (i.e., having characteristics of both microstrip and coplanar structures) has also been used in existing transmission line structures.

The characteristic impedance (Zo) of a transmission line can generally be thought of as the square root of the ratio of inductance (L) to capacitance (C), that is, Zo=SQRT (L/C). In some applications, it is desirable to have a relatively constant characteristic impedance. For example, a constant characteristic impedance reduces the severity of impedance-mismatch between two adjacent transmission structures. Impedance-mismatch can disadvantageously result in undesired characteristics such as reflections, ringing, etc. For example, changes in impedance along a transmission path can result in energy being reflected or dispersed.

However, in conventional microstrip transmission lines, the characteristic impedance varies with signal frequency. This is because the inductance varies with frequency, while the capacitance remains relatively constant across a wide range of frequencies. As a result, conventional microstrip transmission lines normally do not exhibit a relatively constant characteristic impedance over a wide range of signal frequencies. Therefore, it is difficult to optimize a transmission line to operate at a constant Zo over a wide range of frequencies.

Accordingly, there exists a need in the art to overcome the deficiencies and limitations described hereinabove.

SUMMARY

In a first aspect of the invention, there is a method of controlling impedance in a transmission line. The method includes: forming a plurality of openings in a ground plane associated with a signal line; forming a plurality of capacitance plates in the plurality of openings; and connecting the plurality of capacitance plates to the signal line with a plurality of posts extending between the signal line and the plurality of capacitance plates.

In another aspect of the invention, there is a semiconductor transmission line comprising: a signal line formed over a substrate; a plurality of posts extending from the signal line; a plurality of plates corresponding to the plurality of posts; and a ground return line. Each one of the plurality of posts has a first end contacting the signal line and a second end contacting a respective one of the plurality of plates.

In another aspect of the invention, there is a design structure tangibly embodied in a machine readable medium for designing, manufacturing, or testing an integrated circuit. The design structure comprises a signal line formed over a substrate; a plurality of posts extending from the signal line; a plurality of plates corresponding to the plurality of posts; and a ground return line. Each one of the plurality of posts has a first end contacting the signal line and a second end contacting a respective one of the plurality of plates.

BRIEF DESCRIPTION OF THE SEVERAL VIEWS OF THE DRAWINGS

The present invention is described in the detailed description which follows, in reference to the noted plurality of drawings by way of non-limiting examples of exemplary embodiments of the present invention.

DETAILED DESCRIPTION

The invention generally relates to semiconductor transmission lines and, more particularly, to a method, structure, and design structure for an impedance-optimized microstrip transmission line for multi-band and ultra-wide band applications. In accordance with aspects of the invention, a transmission line is provided with a capacitance structure that causes the capacitance of the transmission line to vary based on frequency in a manner similar to the way that inductance varies with frequency. In embodiments, the capacitance structure includes openings (e.g., windows) formed in the ground plane below the signal line, and conductive posts extending from the signal line to plates contained within the openings. In this manner, implementations of the invention exhibit more constant characteristic impedance (Zo) over a wider range of frequencies compared to conventional on-chip microstrip transmission lines. As such, implementations of the invention are useable in ultra-wide band and multi-band analog design applications where transmission lines should ideally exhibit constant characteristics over a large frequency range.

In accordance with aspects of the invention, the capacitance structure adds a specific amount of capacitance, e.g., metal-to-silicon-substrate capacitance, to the signal line. Particularly, the capacitance structure interacts with the silicon-based substrate at lower frequencies to add capacitance to the signal line. At higher frequencies, where the substrate acts as a dielectric instead of a conductor, the substrate does not appreciably affect the capacitance of the signal line. In this manner, the additional capacitance added to the signal path by the capacitance structure and substrate is frequency dependent, and at lower frequencies compensates for the higher inductance of thick metal lines. As such, the capacitance (C) better tracks the inductance (L) with respect to frequency, so that the characteristic impedance (Zo) is more constant over a wide range of frequencies. Accordingly, an advantage of using devices in accordance with aspects of the invention is that the characteristic impedance, and also the matching to and from such devices, is more constant over a broad frequency range of operation compared to conventional microstrip transmission lines. As such, mismatch reflections, ringing, etc., are minimized when using implementations of the invention in multi-band and ultra wide band analog design applications.

Figure 1:
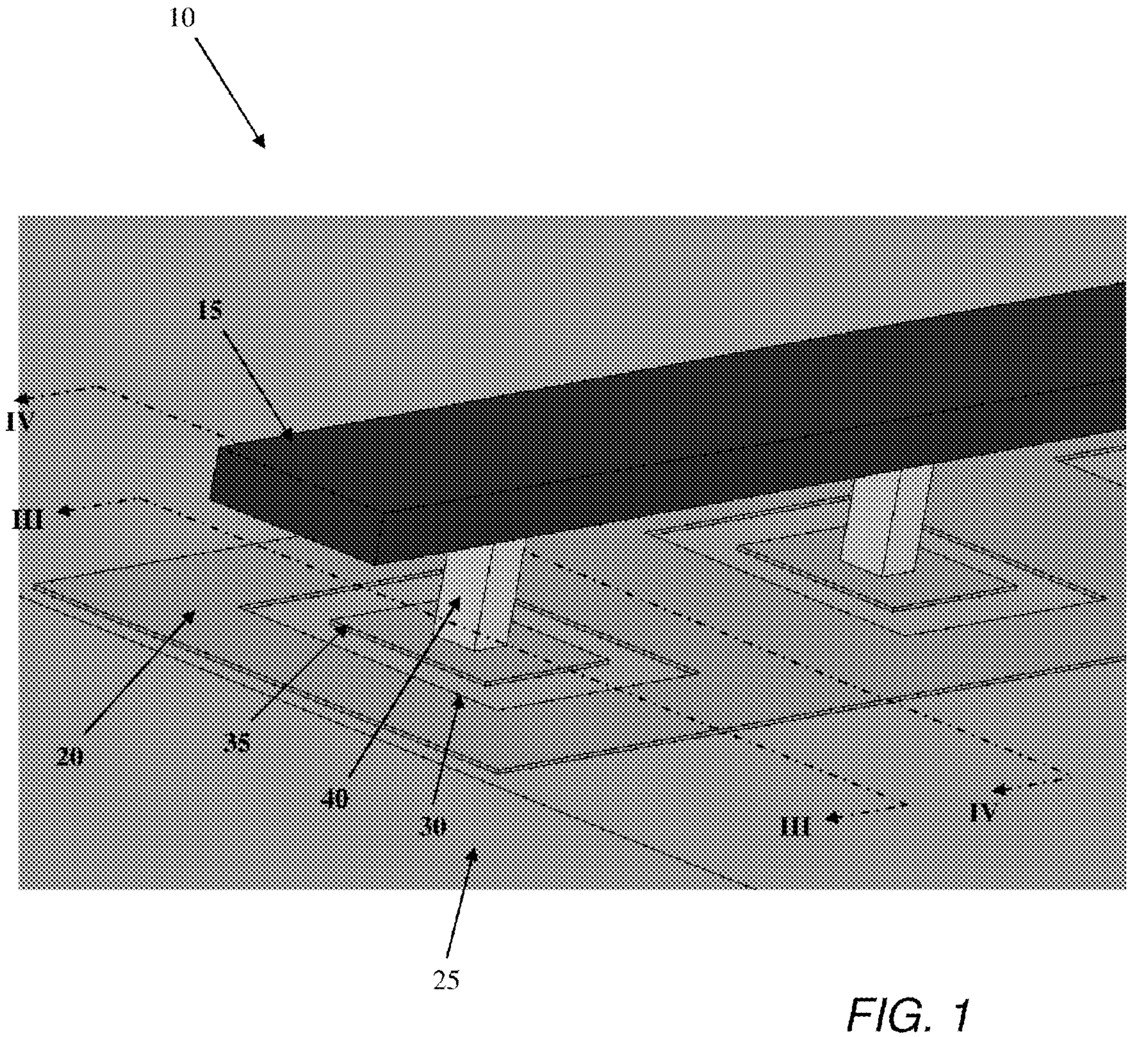
FIGS. 1-4 show views of transmission line structures in accordance with aspects of the invention.
Figure 2:
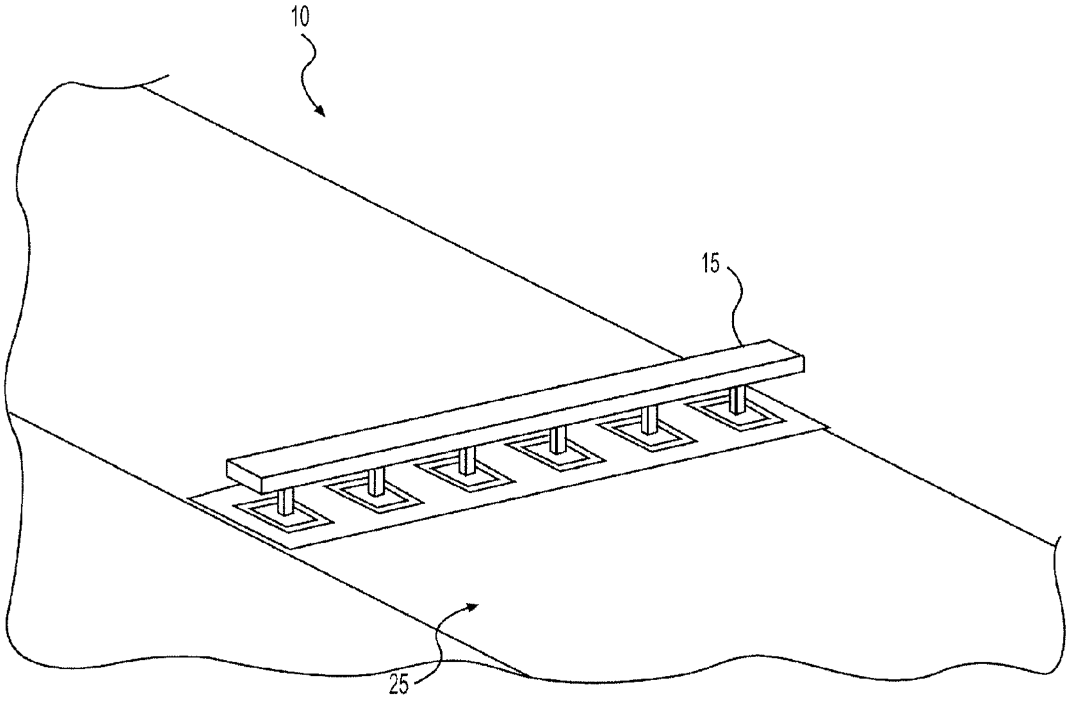

FIGS. 1 and 2 show a transmission line 10 in accordance with aspects of the invention. In embodiments, the transmission line 10 includes a signal line 15 and a ground plane 20 formed above, e.g., over, a silicon-containing substrate 25. The signal line 15 and ground plane 20 are formed in respective layers of dielectric material formed over the substrate 25. The various layers of dielectric material, which may also be referred to as interlevel dielectric (ILD), wiring level, metal layers, etc., are not shown in FIG. 1 in order to clearly depict the features of the transmission line 10.

In embodiments, the transmission line 10 includes openings (e.g., windows) 30 formed in the ground plane 20, capacitance plates (e.g., plates) 35 formed in the openings 30, and posts 40 connecting the plates 35 to the signal line 15. The signal line 15, ground plane 20, plates 35 and posts 40 may all be composed of conductive material, such as any suitable metal, and may be formed using conventional semiconductor fabrication techniques, as described in greater detail below. The substrate 25 may be any conventional silicon-based semiconductor substrate, including but not limited to: Si, SiGe, SiC, SiGeC, and layered semiconductors such as silicon-on-insulator (SOI), Si/SiGe, and SiGe-on-insulator (SGOI).

Figure 3:
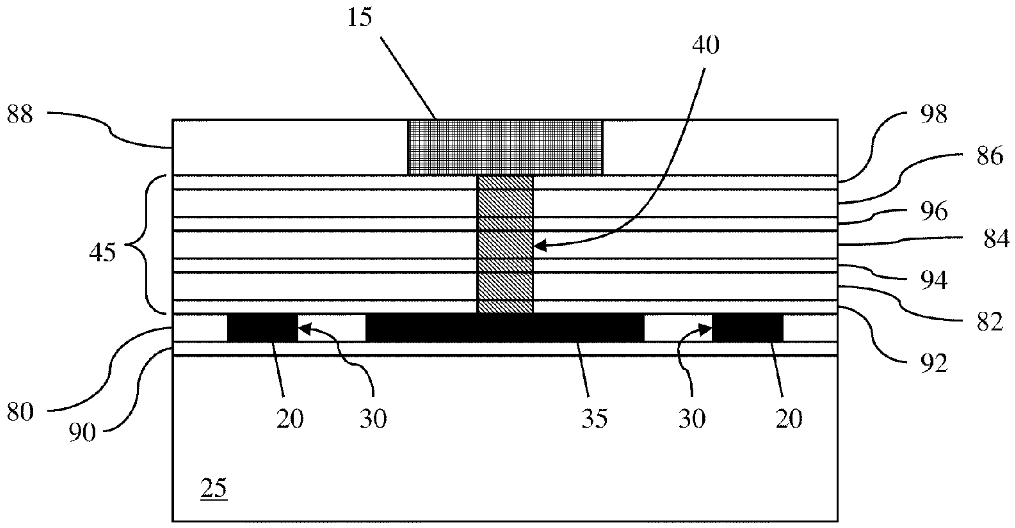
Figure 4:
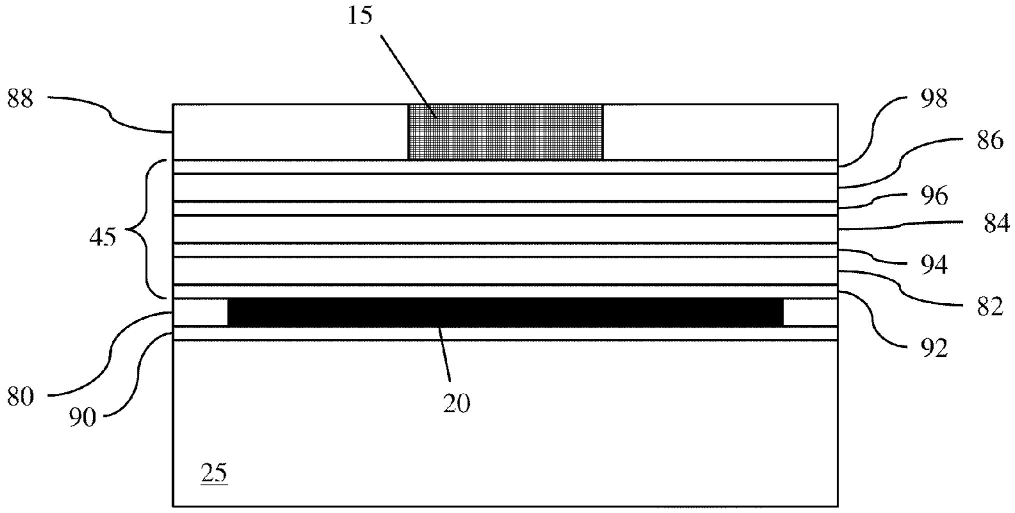

FIGS. 3 and 4 show cross-sectional views of layered semiconductor structures comprising a transmission line in accordance with aspects of the invention. More specifically, FIG. 3 shows a cross sectional view along line III-III of FIG. 1, and FIG. 4 shows a cross sectional view along line IV-IV of FIG. 1.

As depicted in FIGS. 3 and 4, in embodiments, the ground plane 20 and plates 35 are formed as conductive material arranged in a lower layer 80 of dielectric material. The lower layer 80 is formed over the substrate 25, with an insulator layer 90 arranged between the lower layer 80 and the substrate 25. Additionally, in embodiments, the signal line 15 is formed as conductive material arranged in an upper layer 88 of dielectric material, with an intermediate layer 45 formed between the lower layer 80 and the upper layer 88.

In embodiments, the signal line 15 and ground plane 20 may be formed in the same layers as a signal line and ground plane of a conventional microstrip transmission line. For example, the lower layer 80 may be the lowermost wiring level (e.g., metal layer), and the upper layer 88 may be the uppermost wiring level. However, the invention is not limited to the signal line 15 and ground plane 20 being formed in any particular layers. Rather, the signal line 15 and ground plane 20 may be formed in any suitable layers above the substrate 25 in accordance with aspects of the invention.

In embodiments, the posts 40 are formed in the intermediate layer 45. The intermediate layer 45 may comprise one or more layers arranged between the lower layer 80 and the upper layer 88. For example, the intermediate layer 45 may comprise a single layer of dielectric material arranged between the between the lower layer 80 and the upper layer 88. Alternatively, the intermediate layer 45 may comprise plural wiring levels (e.g., metal layers 82, 84, and 86) and plural via layers (e.g., 92, 94, 96, and 98). In either case, each post 40 comprises conductive material that spans the intermediate layer 45 and directly contacts the signal line 15 and a respective plate 35.

According to aspects of the invention, the signal line 15, ground plane 20, plates 35, and posts 40 may be composed of any desired conductive material, including but not limited to, copper, aluminum, tungsten, alloys, etc. For example, the signal line 15, ground plane 20, plates 35, and posts 40 may all be composed of the same material, e.g., copper. Alternatively, different materials may be used for different features. For example, the signal line 15 may be formed of aluminum, the ground plane 20 and plates 35 made of copper, and the posts made of tungsten. However, the invention is not limited to any particular materials, and the signal line 15, ground plane 20, plates 35, and posts 40 may be composed of any combination of conventional conductive material(s).

The dielectric layers (e.g., 90, 80, 45, and 88) may comprise any conventional dielectric material, such as, for example, silicon dioxide ($SiO_2$), tetraethylorthosilicate (TEOS), borophosphosilicate glass BPSG, etc. Moreover, the layers (e.g., 90, 80, 45, and 88) and the signal line 15, ground plane 20, plates 35, and posts 40 may be formed using conventional semiconductor fabrication techniques. For example, the layered structures depicted in FIGS. 3 and 4 may be fabricated using techniques including, but not limited to: photolithographic masking and etching, chemical vapor deposition (CVD), metal deposition, etc.

As depicted in FIG. 3, the dielectric material of lower layer 80 fills the gaps between the ground plane 20 and the plate 35. Thus, the conductive plate 35 is arranged in the window 30 and the remaining portions of the window 30 are filled with dielectric material.

In implementations of the invention, the signal line 15, ground plane 20, plates 35, and posts 40 may be formed in any suitable dimensions. Particularly, these features may be sized and shaped to achieve a desired characteristic impedance (e.g., 50 Ohm) for the transmission line 10, and to add a specific amount of capacitance to the signal line at lower frequencies.

By way of non-limiting example, the signal line 15 may have a thickness (e.g., height) of about 4 μm and a width of about 16 μm. Also, the posts 40 may have a height of about 10 μm to about 15 μm, a width of about 4 μm, and a length of about 4 μm. Additionally, the ground plane 20 may have a height of about 0.32 μm and a width of about 40 μm to about 50 μm. The openings 30 may have a length and width of about 20 μm each. The plates 35 are formed in the same level as the ground plane, and therefore may have the same height as the ground plane 20. Accordingly, the plates 35 may have a height of about 0.32 μm, and a length and width of about 10 μm each. This results in a gap of about 5 μm between the edges of a plate 35 and the edges of the ground plane 20 within the window 30. Moreover, the successive posts 40 may be spaced apart by about 50 μm along the length of the signal line 15. However, the invention is not limited to these dimensions, and any suitable dimensions may be used, e.g., to achieve a desired characteristic impedance.

According to aspects of the invention, the plates 35 interact with the substrate 25 at lower frequencies to add a specific amount of capacitance to the signal line 15. It is understood that a silicon substrate may act as a conductor at frequencies below a particular frequency, e.g., the relaxation frequency, and act as an insulator at frequencies above the relaxation frequency, such that further explanation is not believed necessary. In embodiments, at frequencies below the relaxation frequency of the substrate 25, the substrate 25 acts as a conductor and adds capacitance to the signal line 15 by way of the plates 35 arranged in the openings 30. On the other hand, at frequencies above the relaxation frequency of the substrate 25, the substrate 25 acts as a dielectric and does not add capacitance to the signal line 15. The size and location of the openings 30 and plates 35 have an effect on the amount of capacitance that is added by the substrate at lower frequencies. Accordingly, the size and location of the openings 30 and plates 35 may be designed to add a certain amount of capacitance to the transmission line 10.

The relaxation frequency of the substrate 25 may depend on many factors, including, but not limited to, the compositional make-up of the substrate. For example, the relaxation frequency may be in the range of about 11 and 13 GHz. The invention is not limited to a substrate 25 having any particular relaxation frequency, but rather any suitable substrate 25 having any desired relaxation frequency may be used within the scope of the invention.

In embodiments, by increasing the capacitance (C) of the transmission line 10 at lower frequencies, the capacitance can be optimized to closely mimic the change that inductance (L) undergoes with respect to frequency. The characteristic impedance (Zo) of the transmission line 10 at a given frequency (f) is given by Zo(f)=SQRT(L(f)/C(f)). Therefore, in accordance with aspects of the invention, the characteristic impedance of the transmission line 10 can be made relatively constant across a wide range of frequencies by making the capacitance change with respect to frequency in a manner similar to how the inductance changes based on frequency.

Figure 5:
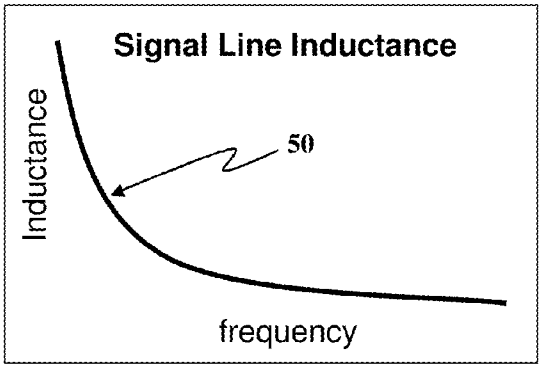
FIGS. 5-7 show plots of inductance, capacitance, and characteristic impedance as a function of frequency in accordance with aspects of the invention.

For example, FIG. 5 shows a generalized curve 50 of signal line inductance versus frequency of a microstrip transmission line. As frequency increases, the current traveling through a signal line migrates toward the outer surfaces of the signal line (e.g., the skin effect), and this causes the inductance to decrease as frequency increases as depicted in FIG. 5, as is known such that further explanation is not believed necessary.

Figure 6:
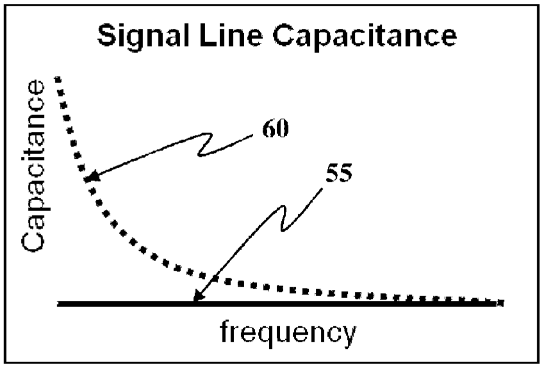
Figure 7:
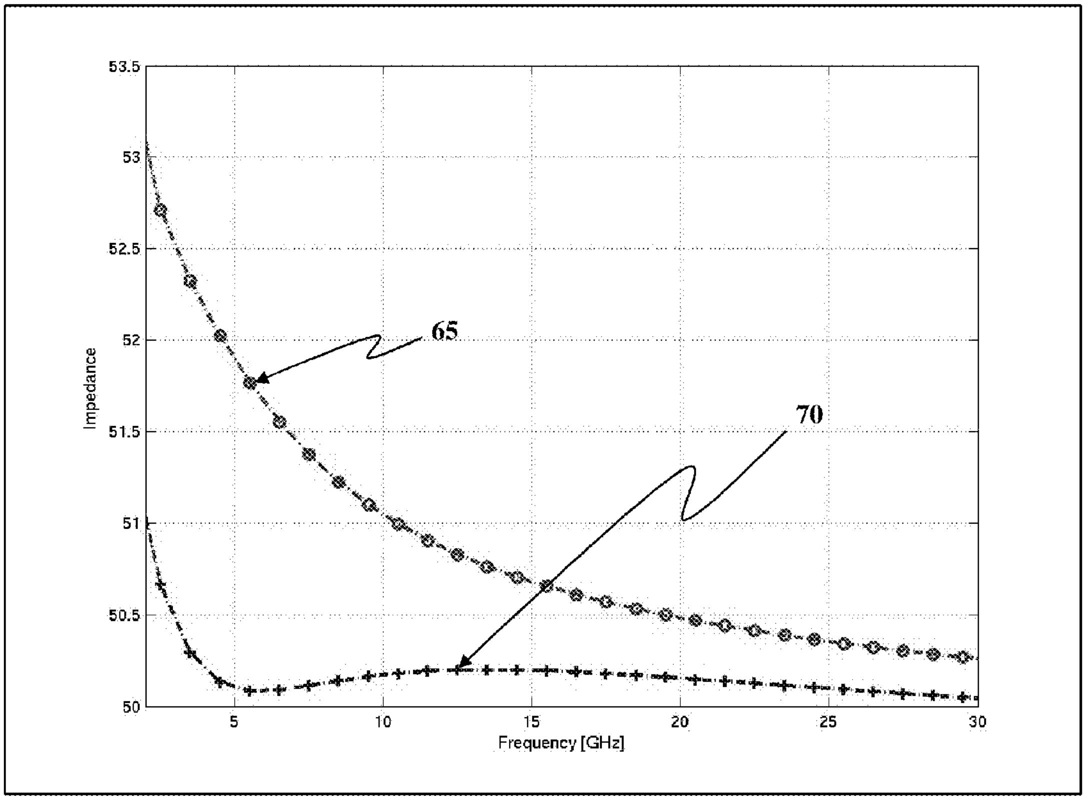

FIG. 6 shows a generalized curve 55 of signal line capacitance versus frequency of a conventional microstrip transmission line, and also a generalized curve 60 of signal line capacitance versus frequency of a microstrip transmission line according to aspects of the invention. As depicted by curve 55, the capacitance of a conventional microstrip transmission line remains relatively constant over a wide range of frequency. This causes the characteristic impedance of a conventional microstrip transmission line to vary depending on frequency, as depicted by curve 65 of FIG. 7.

On the other hand, as depicted by curve 60 of FIG. 6, the capacitance of a transmission line made in accordance with aspects of the invention varies with frequency in a manner similar to the way that inductance varies with frequency. This is because the openings (e.g., openings 30), plates (e.g., plates 35), and posts (e.g., posts 40) function to add capacitance to the signal line 15 at lower frequencies (e.g., at frequencies below the relaxation frequency). Since the capacitance changes with respect to frequency in a manner similar to how the inductance changes with frequency, transmission lines made in accordance with aspects of the invention exhibit a more constant characteristic impedance over a wide range of frequency, as depicted by curve 70 of FIG. 7.

In accordance with aspects of the invention, the specific amount of capacitance that is added may be correspond to a determined magnitude of inductance change, and may be controlled by appropriately sizing and locating the plates and openings. For example, it may be determined that a signal line will suffer about a 10% decrease in inductance over a range of frequency. As such, the plates and openings may be sized and located to provide about a 10% increase in capacitance at lower frequencies.

Accordingly, implementations of the invention provide a passive device that provides more constant characteristic impedance over a wide frequency band compared to conventional micro-strip transmission lines. Implementations of the invention utilize the frequency-dependent nature of silicon substrate capacitance to provide additional capacitance to the signal path at lower frequencies. In embodiments, this compensates for the higher DC (e.g., low frequency) inductance of thick metal lines, and makes the characteristic impedance maximally flat versus frequency.

Particularly, in embodiments, metal-to-silicon substrate capacitance structures (e.g., the plates) are located in openings (e.g., windows) in the bottom ground shield (e.g., ground plane) to provide access to the silicon substrate for adding capacitance at lower frequencies (e.g., at frequencies below the relaxation frequency). Implementations of the invention may advantageously be used in multi-band and ultra-wide band applications, such as, for example, an analog chip that operates in both the WCDMA frequency range (e.g., 2.11-2.17 GHz) and also at MMW frequencies (e.g., greater than 30 GHz). The relatively constant characteristic impedance of devices made in accordance with aspects of the invention reduce the effects of reflections and/or ringing that would occur in a conventional microstrip operating between such frequency ranges.

Figure 8:
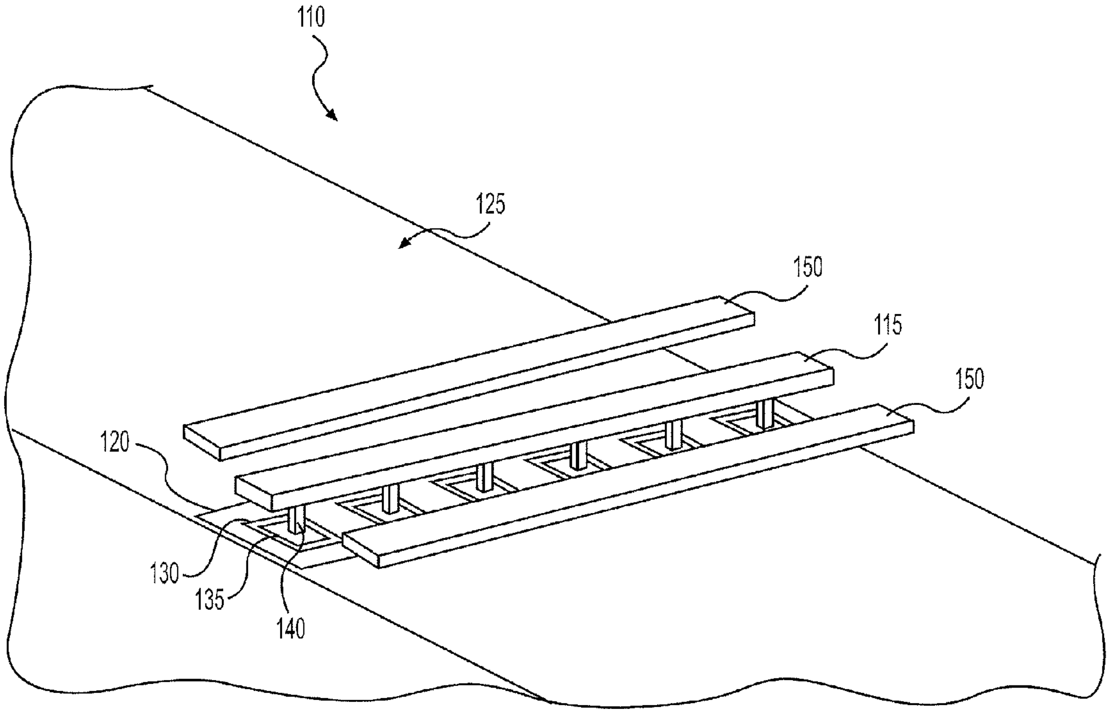
FIGS. 8 and 9 show views of transmission line structures in accordance with aspects of the invention.

FIG. 8 shows another embodiment of a transmission line in accordance with aspects of the invention. Particularly, FIG. 8 shows a transmission line 110 having a signal line 115, ground plane 120, substrate 125, windows 130, plates 135, and posts 140, which may be the same as the corresponding features shown in FIG. 1. The transmission line 110 also includes coplanar waveguide side-shields 150. In embodiments, the coplanar waveguide side-shields 150 comprise metal traces formed in the same layer as the signal line 115 (e.g., layer 88), and are tied to (e.g., electrically coupled to) the ground plane 120.

Figure 9:
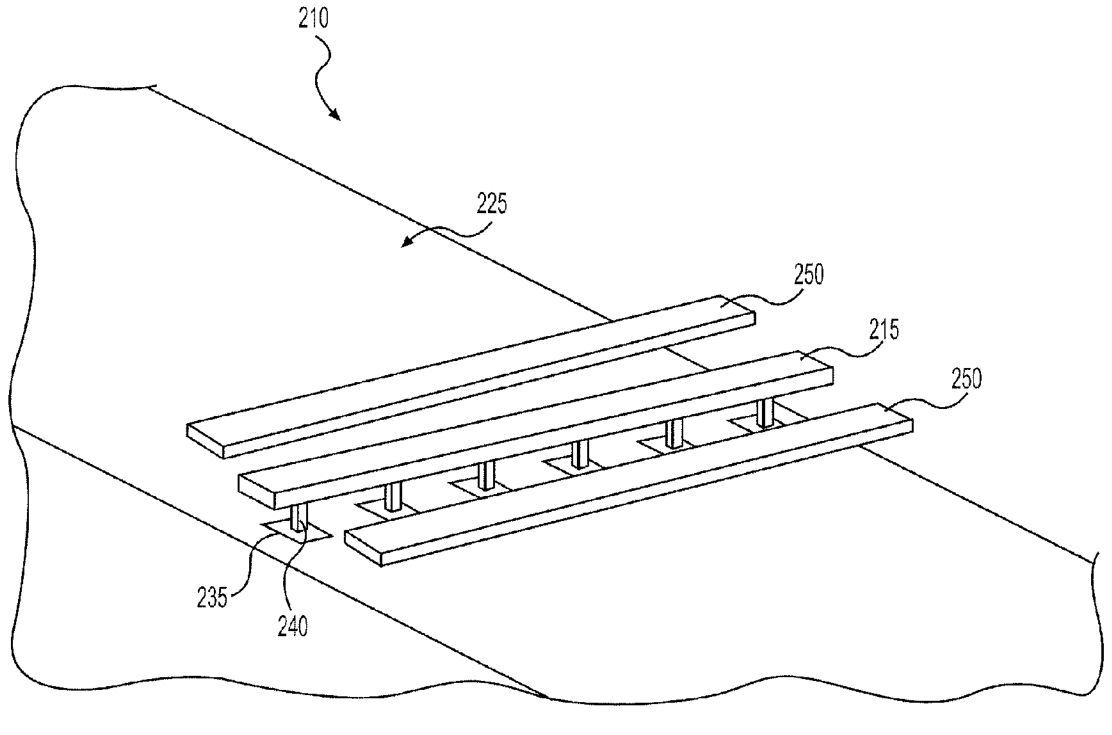

FIG. 9 shows another embodiment of a transmission line in accordance with aspects of the invention. Particularly, FIG. 9 shows a transmission line 210 having a signal line 215, substrate 225, plates 240, posts 240, and coplanar waveguide side-shields 250, which may be the same as the corresponding features shown in FIG. 8. In contrast to FIGS. 1 and 8, however, the transmission line 210 does not include a ground plane formed under the signal line 215. Instead, in the embodiment depicted in FIG. 9, the coplanar waveguide side-shields 250 function as the ground return lines for the transmission line 210. In this manner, the coplanar waveguide side-shields 250 are not tied to an additional ground plane arranged beneath the signal line 215.

Figure 10:
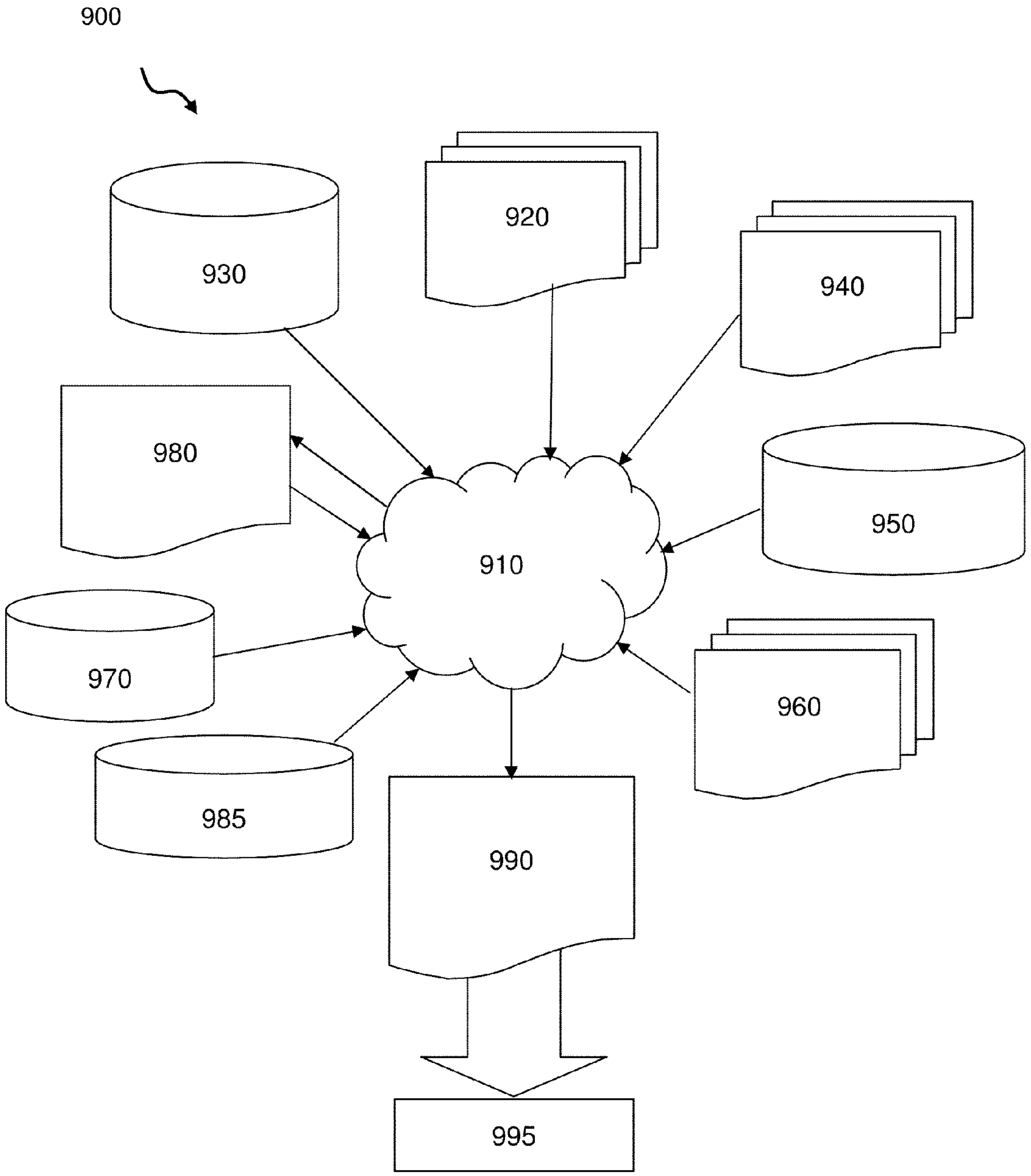
FIG. 10 is a flow diagram of a design process used in semiconductor design, manufacture, and/or test.

FIG. 10 shows a block diagram of an exemplary design flow 900 used for example, in semiconductor IC logic design, simulation, test, layout, and manufacture. Design flow 900 includes processes and mechanisms for processing design structures or devices to generate logically or otherwise functionally equivalent representations of the design structures and/or devices described above and shown in FIGS. 1-4, 8, and 9. The design structures processed and/or generated by design flow 900 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Design flow 900 may vary depending on the type of representation being designed. For example, a design flow 900 for building an application specific IC (ASIC) may differ from a design flow 900 for designing a standard component or from a design flow 900 for instantiating the design into a programmable array, for example a programmable gate array (PGA) or a field programmable gate array (FPGA) offered by Altera® Inc. or Xilinx® Inc.

FIG. 10 illustrates multiple such design structures including an input design structure 920 that is preferably processed by a design process 910. Design structure 920 may be a logical simulation design structure generated and processed by design process 910 to produce a logically equivalent functional representation of a hardware device. Design structure 920 may also or alternatively comprise data and/or program instructions that when processed by design process 910, generate a functional representation of the physical structure of a hardware device. Whether representing functional and/or structural design features, design structure 920 may be generated using electronic computer-aided design (ECAD) such as implemented by a core developer/designer. When encoded on a machine-readable data transmission, gate array, or storage medium, design structure 920 may be accessed and processed by one or more hardware and/or software modules within design process 910 to simulate or otherwise functionally represent an electronic component, circuit, electronic or logic module, apparatus, device, or system such as those shown in FIGS. 1-4, 8, and 9. As such, design structure 920 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 910 preferably employs and incorporates hardware and/or software modules for synthesizing, translating, or otherwise processing a design/simulation functional equivalent of the components, circuits, devices, or logic structures shown in FIGS. 1-4, 8, and 9 to generate a netlist 980 which may contain design structures such as design structure 920. Netlist 980 may comprise, for example, compiled or otherwise processed data structures representing a list of wires, discrete components, logic gates, control circuits, I/O devices, models, etc. that describes the connections to other elements and circuits in an integrated circuit design. Netlist 980 may be synthesized using an iterative process in which netlist 980 is resynthesized one or more times depending on design specifications and parameters for the device. As with other design structure types described herein, netlist 980 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 910 may include hardware and software modules for processing a variety of input data structure types including netlist 980. Such data structure types may reside, for example, within library elements 930 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 940, characterization data 950, verification data 960, design rules 970, and test data files 985 which may include input test patterns, output test results, and other testing information. Design process 910 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 910 without deviating from the scope and spirit of the invention. Design process 910 may also include modules for performing standard circuit design processes such as timing analysis, verification, design rule checking, place and route operations, etc.

Design process 910 employs and incorporates logic and physical design tools such as HDL compilers and simulation model build tools to process design structure 920 together with some or all of the depicted supporting data structures along with any additional mechanical design or data (if applicable), to generate a second design structure 990. Design structure 990 resides on a storage medium or programmable gate array in a data format used for the exchange of data of mechanical devices and structures (e.g. information stored in a IGES, DXF, Parasolid XT, JT, DRG, or any other suitable format for storing or rendering such mechanical design structures). Similar to design structure 920, design structure 990 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 1-4, 8, and 9. In one embodiment, design structure 990 may comprise a compiled, executable HDL simulation model that functionally simulates the devices shown in FIGS. 1-4, 8, and 9.

Design structure 990 may also employ a data format used for the exchange of layout data of integrated circuits and/or symbolic data format (e.g. information stored in a GDSII (GDS2), GL1, OASIS, map files, or any other suitable format for storing such design data structures). Design structure 990 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 1-4, 8, and 9. Design structure 990 may then proceed to a stage 995 where, for example, design structure 990: proceeds to tape-out, is released to manufacturing, is released to a mask house, is sent to another design house, is sent back to the customer, etc.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below, where applicable, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated. Accordingly, while the invention has been described in terms of embodiments, those of skill in the art will recognize that the invention can be practiced with modifications and in the spirit and scope of the appended claims.

What is claimed:

1. A semiconductor transmission line, comprising:
- a signal line formed over a substrate;
- a plurality of posts extending from the signal line;
- a plurality of plates corresponding to the plurality of posts; and
- a ground return line,
- wherein each one of the plurality of posts has a first end contacting the signal line and a second end contacting a respective one of the plurality of plates.

2. The semiconductor transmission line of claim 1, wherein:
- the ground return line and the plurality of plates are formed in a lowermost wiring level, and
- the signal line is formed in an uppermost wiring level.

3. The semiconductor transmission line of claim 1, further comprising an insulator between a bottom of the plurality of plates and a top of the substrate.

4. The semiconductor transmission line of claim 1, wherein each one of the plurality of posts spans plural levels between the signal line and a layer containing the plurality of plates.

5. The semiconductor transmission line of claim 1, further comprising two coplanar waveguide side-shields formed in a same level as the signal line, wherein the coplanar waveguide side-shields are tied to the ground return line.

6. The semiconductor transmission line of claim 1, wherein:
- the ground return line comprises two coplanar waveguide side-shields that are formed in a same level as the signal line, and
- the transmission line is devoid of a ground plane beneath the signal line.

7. The semiconductor transmission line of claim 1, wherein the ground return line is formed in a same plane as the plurality of plates.

8. The semiconductor transmission line of claim 7, wherein:
- the ground return line comprises a plurality of openings, and
- each one of the plurality of plates is arranged in a respective one of the plurality of openings.

9. The semiconductor transmission line of claim 8, wherein the plurality of openings and the plurality of plates are sized to add an amount of capacitance corresponding to a predetermined amount of decrease of an inductance.

10. The semiconductor transmission line of claim 8, wherein the plurality of plates are structured and arranged to interact with the substrate to add capacitance to the signal line at frequencies less than a threshold frequency.

11. The semiconductor transmission line of claim 10, wherein
- the substrate comprises silicon, and
- the threshold frequency is a relaxation frequency of the substrate.

12. A design structure tangibly embodied in a non-transitory machine readable medium for designing, manufacturing, or testing an integrated circuit, the design structure comprising:
- a signal line formed over a substrate;
- a plurality of posts extending from the signal line;
- a plurality of plates corresponding to the plurality of posts; and
- a ground return line,
- wherein each one of the plurality of posts has a first end contacting the signal line and a second end contacting a respective one of the plurality of plates.

13. The design structure of claim 12, wherein the design structure comprises a netlist.

14. The design structure of claim 12, wherein the design structure resides on storage medium as a data format used for the exchange of layout data of integrated circuits.

15. The design structure of claim 12, wherein the design structure resides in a programmable gate array.

16. A method for controlling characteristic impedance in a transmission line, comprising:
- forming a plurality of openings in a ground plane associated with a signal line;
- forming a plurality of capacitance plates in the plurality of openings; and
- connecting the plurality of capacitance plates to the signal line with a plurality of posts extending between the signal line and the plurality of capacitance plates.

17. The method of claim 16, further comprising sizing the capacitance plates to provide additional capacitance to the signal line at frequencies below a relaxation frequency of a substrate on which the transmission line is formed, wherein the additional capacitance corresponds to a determined loss of induction based on frequency.

18. The method of claim 16, further comprising forming coplanar waveguide side-shields in a same plane as the signal line, wherein the coplanar waveguide side-shields are tied to ground.

19. The method of claim 16, wherein the forming the plurality of capacitance plates comprises forming the plurality of capacitance plates in a same layer as the ground plane.

20. The method of claim 19, further comprising forming the signal line in a layer above the ground plane.

* * * * *